United States Patent
Rhodes et al.

(10) Patent No.: US 11,029,275 B2
(45) Date of Patent: Jun. 8, 2021

(54) DEVICE FOR DETECTING A WEAR LEVEL OF A WEAR PLATE

(71) Applicant: Deere & Company, Moline, IL (US)

(72) Inventors: Michael L. Rhodes, Richfield, MN (US); Kevin P. Cowles, Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 11 days.

(21) Appl. No.: 16/165,467

(22) Filed: Oct. 19, 2018

(65) Prior Publication Data

US 2020/0124560 A1    Apr. 23, 2020

(51) Int. Cl.
| | |
|---|---|
| *G01N 27/24* | (2006.01) |
| *G01N 27/22* | (2006.01) |
| *G08B 21/18* | (2006.01) |
| *H03K 19/20* | (2006.01) |
| *G07C 5/08* | (2006.01) |

(52) U.S. Cl.
CPC .......... *G01N 27/24* (2013.01); *G01N 27/221* (2013.01); *G08B 21/182* (2013.01); *H03K 19/20* (2013.01); *G07C 5/0808* (2013.01); *G07C 5/0816* (2013.01)

(58) Field of Classification Search
CPC .... G01N 27/24; G01N 27/221; G08B 21/182; H03K 19/20; G07C 5/0808; G07C 5/0816
See application file for complete search history.

(56) References Cited

U.S. PATENT DOCUMENTS

| | | |
|---|---|---|
| 9,939,247 B1 | 4/2018 | Dardona et al. |
| 2005/0158511 A1 | 7/2005 | Sabol et al. |
| 2010/0005895 A1 | 1/2010 | Lv et al. |
| 2010/0068508 A1* | 3/2010 | Shinde ............ G01N 3/56 428/332 |
| 2011/0169651 A1* | 7/2011 | Mitchell ........... F04C 14/00 340/679 |
| 2011/0210749 A1 | 9/2011 | Williams et al. |

(Continued)

FOREIGN PATENT DOCUMENTS

| | | |
|---|---|---|
| DE | 209691 A1 | 5/1984 |
| EP | 2637014 A1 | 9/2013 |

(Continued)

OTHER PUBLICATIONS

Clingerman, Matthew Lee. "Development and Modeling of Electrically Conductive Composite Materials." PhD dissertation. Michigan Technological University, 2001 [online], [retrieved Nov. 26, 2018]. Retrieved from the Internet: <URL:http://www.chem.mtu.edu/org/ctc/pdf/mlc%20dissertation.pdf>.

(Continued)

*Primary Examiner* — Jay Patidar

(57) ABSTRACT

A first conductor is embedded in the first dielectric layer to a first wear depth, where the first wear depth is associated with a first threshold wear level. A second dielectric layer overlies the first dielectric layer to a second wear depth. The second wear depth is associated with a second threshold wear level greater than the first threshold wear level. A second conductor is embedded in the second dielectric layer and separate from the first conductor. An indicator is adapted to indicate whether the wear plate is the first threshold wear level or the second threshold wear level.

20 Claims, 4 Drawing Sheets

(56) References Cited

U.S. PATENT DOCUMENTS

2012/0043980 A1*  2/2012  Davies .................... G01B 7/18
                                                                324/693
2017/0361719 A1    12/2017 Doucet et al.

FOREIGN PATENT DOCUMENTS

| EP | 3345840 A1 | 7/2018 |
| JP | 2015099083 A | 5/2015 |
| KR | 20170011600 A | 2/2017 |

OTHER PUBLICATIONS

U.S. Appl. No. 16/172,722, filed Oct. 26, 2018.
European Search Report issued in counterpart European Patent Application No. 19203063.3, dated Mar. 17, 2020 (8 pages).

* cited by examiner

… (1)

DEVICE FOR DETECTING A WEAR LEVEL OF A WEAR PLATE

FIELD

This disclosure relates to a device for detecting wear of a wear plate.

BACKGROUND

In off-road vehicles and equipment, some portions of the vehicle or implements may wear from contact with harvested agricultural materials, mined ore, mined materials, gravel, crushed stone, concrete or asphalt, ceramics, steel, ground, clay, sand, abrasive materials, or other materials. The off-road vehicles and equipment may use replaceable wear plates from wear-resistant, durable or sacrificial materials to protect underlying structural members. The wear plats are sometimes located in inaccessible locations in the equipment, implement or machinery that is difficult to inspect without incurring significant labor or maintenance costs. Accordingly, there is a need to continuously monitor wear plates for signs of wear and warn or alert the operator when or that the wear plate may require replacement.

SUMMARY

In accordance with one embodiment, a device for detecting wear of a wear plate comprises a first dielectric layer and a second dielectric layer. A first conductor is embedded in the first dielectric layer to a first wear depth, where the first wear depth is associated with a first threshold wear level. A second dielectric layer overlies the first dielectric layer to a second wear depth. The second wear depth is associated with a second threshold wear level greater than the first threshold wear level. A second conductor is embedded in the second dielectric layer and separate from the first conductor. An indicator is adapted to indicate whether the wear plate is the first threshold wear level or the second threshold wear level.

DETAILED DESCRIPTION

Figure 1:
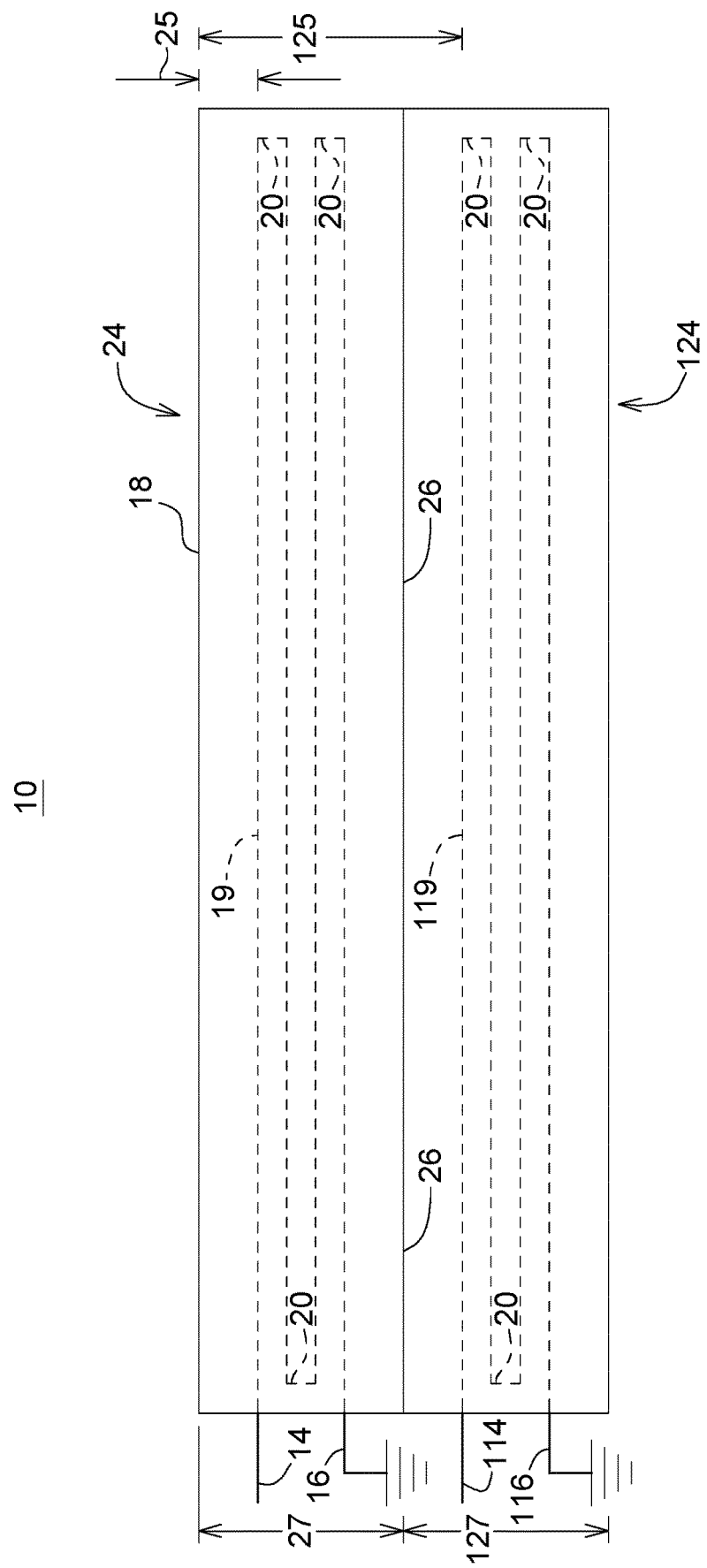
FIG. 1 is cross-sectional plan view of wear plate comprising dielectric layers with embedded conductors.
Figure 2:
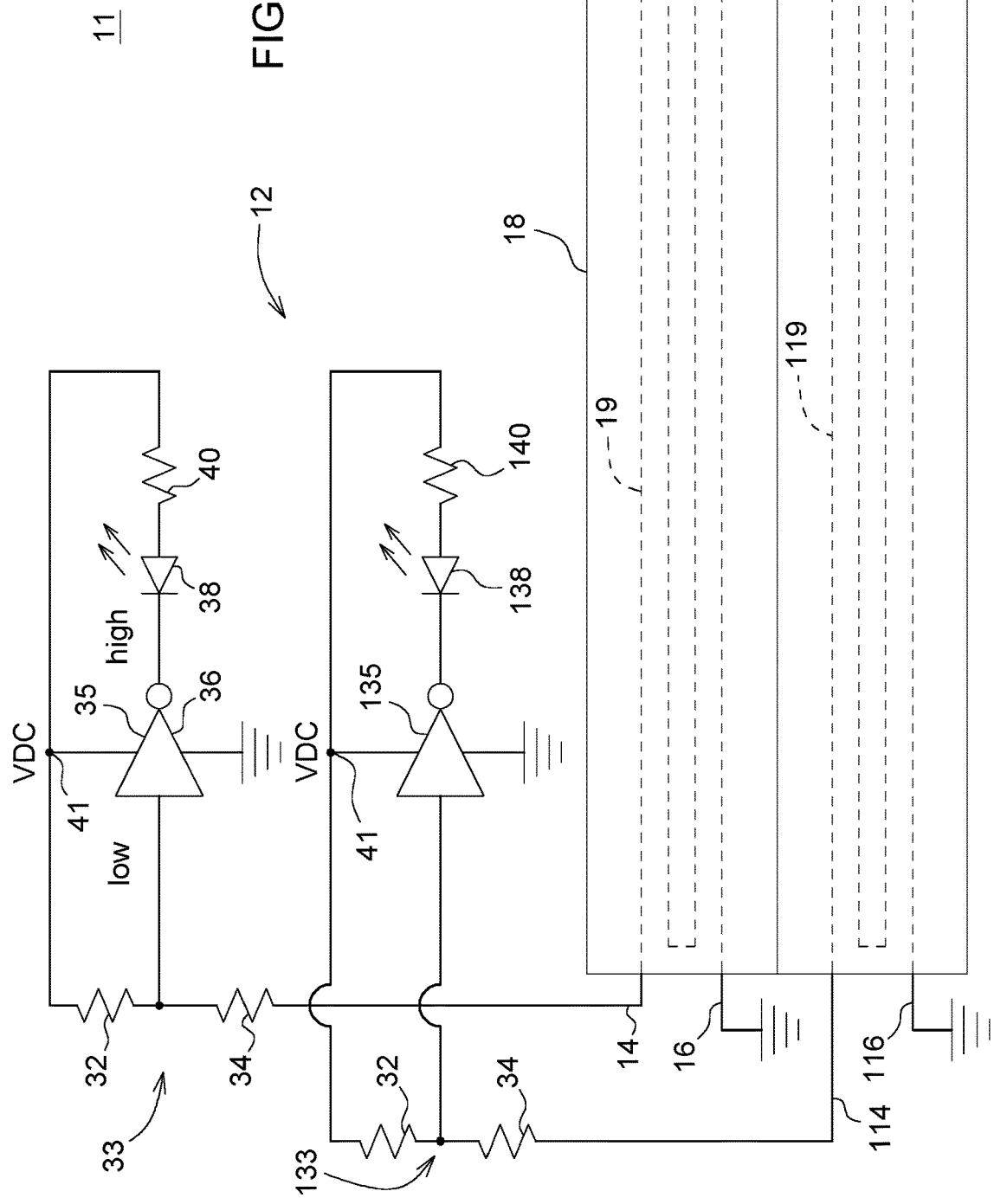
FIG. 2 is a schematic diagram for an indicator to indicate the wear level of the wear plate of FIG. 1.

In accordance with one embodiment of FIG. 1 and FIG. 2, a wear detection device 11 is capable of detecting wear of a laminated wear plate 10. The laminated wear plate 10 comprises a first dielectric layer 24 and a second dielectric layer 124. In one embodiment, the first dielectric layer 24 has a first thickness 27 and the second dielectric layer 124 has a second thickness 127. A first conductor 19 is embedded in the first dielectric layer 24 to a first wear depth 25, where the first wear depth 25 is associated with a first threshold wear level.

A second dielectric layer 124 overlies the first dielectric layer 24 to a second wear depth 125. The second wear depth 125 is associated with a second threshold wear level greater than the first threshold wear level. A second conductor 119 is embedded in the second dielectric layer 124 and separate from the first conductor 19. In general, the first wear depth 25 is less than the first thickness 27 of the first dielectric layer 24 and can be adjusted within a range from approximately zero depth to approach the first thickness 27. Similarly, the second wear depth 125 is less than the second thickness 127 of the second dielectric layer 124 and can be adjusted with a range from approximately zero depth to approach the second thickness 127. The first dielectric layer 24 is associated with a first wear surface 18 that may contact a wear member (not shown) or material that wears, abrades or contacts the first wear surface 18. Similarly, the second dielectric layer 124 is associated with a second wear surface 26 that may contact a wear member (not shown) or material that wears, abrades or contacts the second wear surface 26.

The first conductor 19 has a first input terminal 14 and a first output terminal 16. The second conductor 119 has a second input terminal 114 and a second output terminal 116. The first input terminal 14 and the second input terminal 114 may be coupled to a signal source or a direct current source, a direct current voltage bus, or grounded. An indicator 12, such as continuity evaluation circuit, is adapted to indicate whether the wear plate 10 is at the first threshold wear level or at the second threshold wear level.

In one configuration, the first conductor 19 comprises a wire, conductive trace, or foil trace that traverses a first dielectric layer 24 of the laminated wear plate 10; the second conductor 119 comprises a wire, conductive trace, or foil trace that traverses a second dielectric layer 124 of the laminated wear plate 10. As illustrated in FIG. 1, the first conductor 19 takes a circuitous route through the first dielectric layer 24 of parallel rows and end turns 20. Similarly, the second conductor 119 takes a circuitous route through the second dielectric layer 124 of parallel rows and end turns 20. The first dielectric layer 24 and the second dielectric layer 124 are composed of a wear material that wears away by friction, heat, abrasion or mechanical contact by a contact member (e.g., 54 in FIG. 4) that contacts the wear material or laminated wear plate (10 or 52). At the interface (e.g., 56 in FIG. 4) of the wear surface of the laminated wear plate 52 and the contact surface of an adjoining contact member 54, there may or may not be oil, grease, or water or another lubricant to reduce friction or wear. In some examples, the contact member 54 may represent harvested material, mined ore, or other materials that are work product or intermediate work product that is processed, whereas in other cases the contact member 54 may be a component or part of off-road equipment or vehicle, or its implement.

In one embodiment, as illustrated in FIG. 2, the indicator 12 comprises a first resistive voltage divider 33 that is coupled to a first amplifier 35. The first resistive voltage divider 33 may comprise a first resistor 32 and second resistor 34. A first node of the first resistive voltage divider 33 is connected to positive direct current terminal 41 (e.g., of the direct current bus), a second node is connected to a first output terminal 16 of the first conductor 19, and a third node, which is associated with a divided voltage of the resistive voltage divider, is coupled to the first amplifier 35. A first amplifier 35 has an amplifier input coupled to the divided voltage or third node of the first resistive voltage divider 33. The first amplifier 35 has an amplifier output coupled to the first light source 38. A first light source 38 is connected in series with an output resistor 40. In turn, the combination of the first light source 38 and the series output resistor 40 is connected to a positive direct current terminal 41 (e.g., of the direct current bus). The indicator 12 detects the continuity of the first conductor 19 between a first output terminal 16 of the first conductor 19 and the first input terminal 14 of the first conductor 19, where the first output terminal 16 is grounded or connected to a negative direct current terminal.

In one configuration, the first amplifier 35 activates the first light source 38 to indicate that the laminated wear plate 10 is worn to the first threshold wear level, or to provide another alert to the operator, such as an alarm, buzzer or visual alert. As illustrated in FIG. 2, an opposite end of the first conductor 19 is grounded or connected to a negative direct current terminal. Meanwhile, the first amplifier 35 is an inverting amplifier. If there is continuity in the first conductor 19, the first light source 38 is off because the input to the first amplifier 35 is a low logic level. Conversely, if there is no continuity in the first conductor 19 the first light source 38 is on because the input to the first amplifier 35 is a high logic level. In one configuration, the first resistive voltage divider 33 provides a low logic level input to the first amplifier 35 if there is continuity in the first conductor 19 and provides a high logic level input to the first amplifier 35 if there is no continuity. In one example, the first light source 38 comprises a light emitting diode, a light bulb, a display or another visual indicator.

In another embodiment, the indicator 12 further comprises a second resistive voltage divider 133 coupled to one end of the second conductor 119. The second resistive voltage divider 133 may comprise a first resistor 32 and second resistor 34. A first node of the second resistive voltage divider 133 is connected to positive direct current terminal 41, a second node is connected to a second output terminal 116 of the second conductor 119, and a third node, which is associated with a divided voltage of the second resistive voltage divider 133, is coupled to the second amplifier 135. A second amplifier 135 has an amplifier input coupled to the divided voltage or third node of the second resistive voltage divider 133. The second amplifier 135 has an amplifier output coupled to the second light source 138. A second light source 138 is connected in series with an output resistor 140. In turn, the combination of the second light source 138 and the series output resistor 140 is connected to a positive direct current terminal 41. The indicator 12 detects the continuity of the second conductor 119 between a second output terminal 116 of the second conductor 119 and the second input terminal 114 of the second conductor 119, where the second output terminal 116 is grounded or connected to a negative direct current terminal.

The second amplifier 135 activates the second light source 138 to indicate that the laminated wear plate 10 is worn to the second threshold wear level. In one configuration, an opposite end of the second conductor 119 is grounded or connected to negative direct current bus. Meanwhile, the second amplifier 135 is an inverting amplifier such that if there is continuity in the second conductor 119, the second light source 138 is off because the input to the second amplifier 135 is a low logic level.

In one embodiment, an opposite end or second input terminal 114 of the second conductor 119 is grounded or connected to a negative terminal of the direct current bus; the second amplifier 135 is an inverting amplifier. If there is continuity in the second conductor 119 the second light source 138 is off because the input to the second amplifier 135 is a low logic level. However, if there is no continuity in the second conductor 119, the second light source 138 is on because the input to the second amplifier 135 is a high logic level. In one configuration, the second resistive voltage divider 133 provides a low logic level input to the second amplifier 135 if there is continuity in the second conductor 119 and provides a high logic level input to the second amplifier 135 if there is no continuity. In one example, the second light source 138 comprises a light emitting diode, a light bulb, a display or another visual indicator 12.

The first wear depth 25 and the second wear depth 125 can be adjusted or customized during the manufacturing process in accordance with various techniques that may be applied separately or cumulatively. Under a first technique, the first wear depth 25 indicates the first wear level of between approximately twenty five percent of a maximum wear level and approximately fifty percent of the maximum wear level. Under a second technique, the second wear depth 125 indicates the second wear level of between approximately fifty percent of the maximum wear level and approximately seventy-five percent of the maximum wear level. Under a third technique, first wear level or the second wear level indicates a remaining longevity of a wear plate 10 or when the wear plate 10 should be scheduled for replacement. Under a fourth technique, the wear plate 10 material, such as the first dielectric material or the second dielectric material, may be adjusted to composed to increase or decrease a wear rate. In one example, the first dielectric layer 24 and the second dielectric layer 124 comprise a wear plate 10 composed of ceramic, a polymer, a plastic, a fiber-filled polymer, a fiber-filled plastic, a plastic composite with ceramic filler particles, or a polymer composite with ceramic filler particles.

Figure 3:
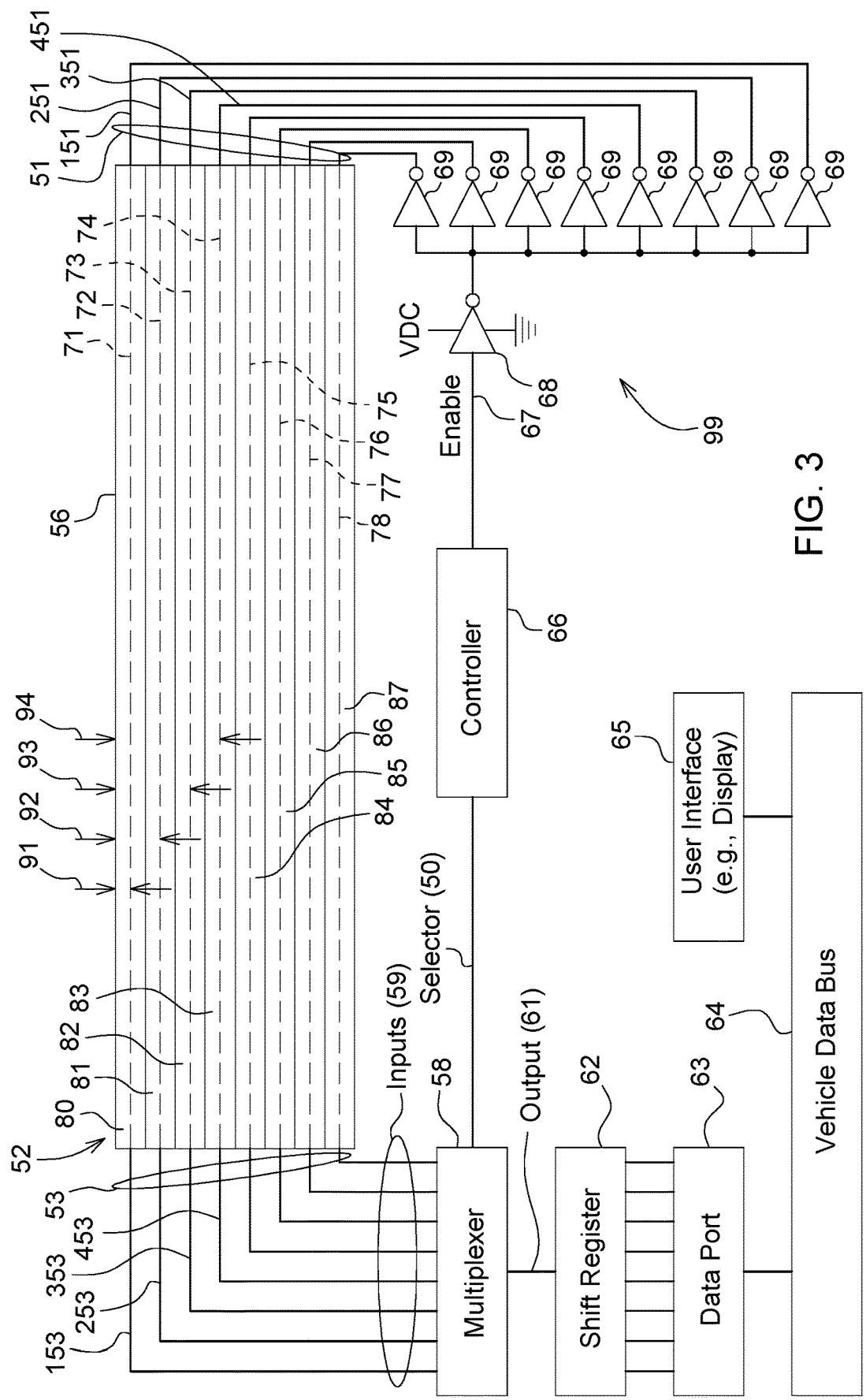
FIG. 3 is block diagram of for a device for detecting a wear level of a wear plate.
Figure 4:
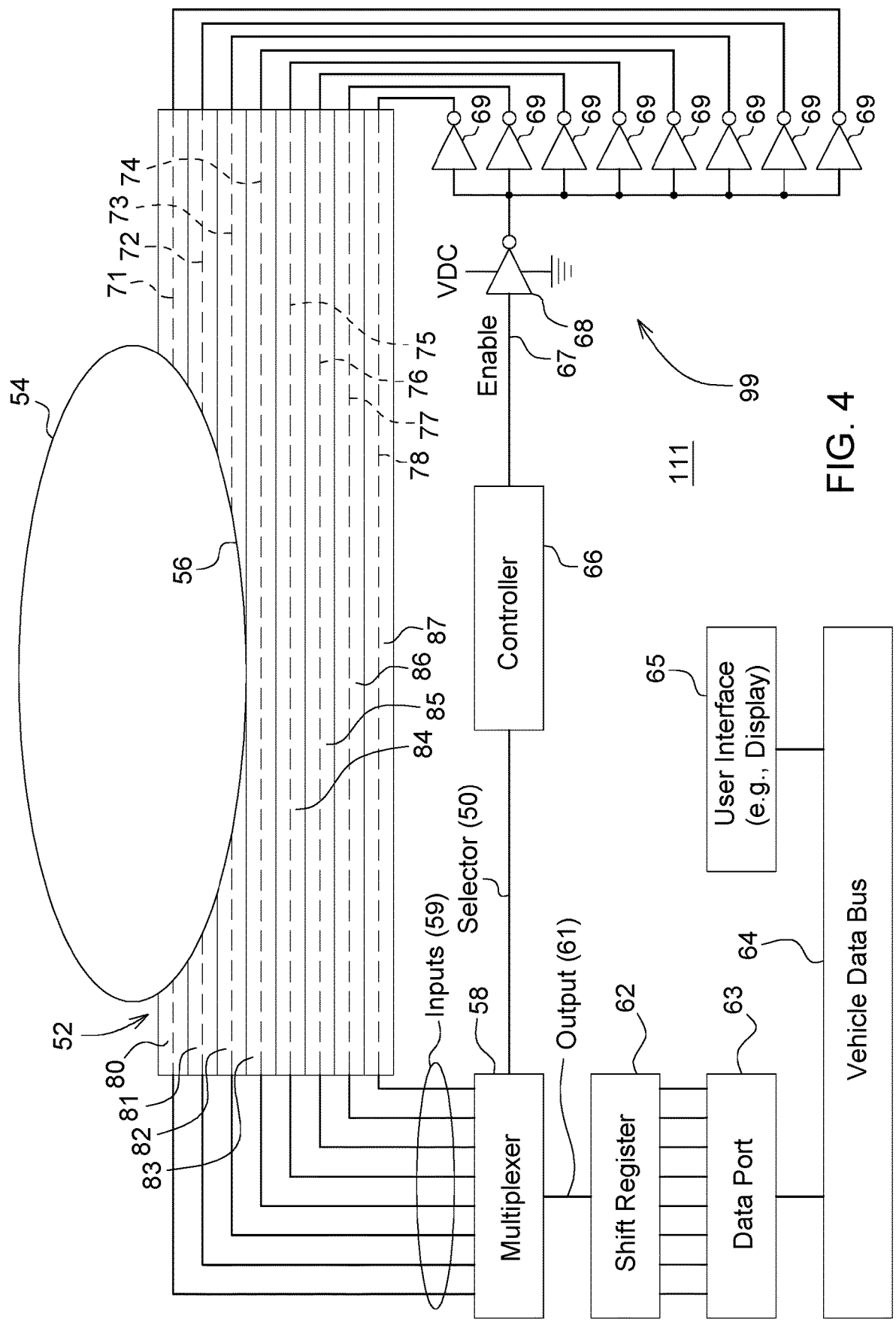
FIG. 4 is a block diagram for a device for detecting a wear level of a wear plate where a contact member engages the wear plate to an illustrative wear depth.

FIG. 3 and FIG. 4 illustrate a block diagram for a wear detection device 111 for detecting wear of a laminated wear plate 52. Although the laminated wear plate 52 of FIG. 3 and FIG. 4 has eight dielectric layers (80, 81, 82, 83, 84, 85, 86, 87) and eight corresponding embedded conductors (71, 72, 73, 74, 75, 76, 77, 78) to provide up to eight respective wear levels to an operator of a vehicle, any number of dielectric layers and corresponding embedded conductors greater than or equal to two may be used in practice. The device 111 for detecting wear of a wear plate 52 comprises at least a first dielectric layer 80 and a second dielectric layer 81 overlying the first dielectric layer 80 or adjacent to the first dielectric layer 80. A first conductor 71 is embedded in the first dielectric layer 80 to a first wear depth 91. The first wear depth 91 is associated with a first threshold wear level. The first conductor 71 has a first input terminal 151 and a first output terminal 153.

A second dielectric layer 81 overlies the first dielectric layer 80 to a second wear depth 92. The second wear depth 92 is associated with a second threshold wear level greater than the first threshold wear level. A second conductor 72 is embedded in the second dielectric layer 81. The second conductor 72 is separate and electrically isolated from the first conductor 71. The second conductor 72 has a second input terminal 251 and second output terminal 253.

A logic level source is coupled to at least the first input terminal 151 and second input terminal 251. In one embodiment, the logic level source may comprise a primary amplifier 68 (e.g., first stage amplifier) that enables and drives a plurality of secondary amplifiers 69 (e.g., second stage amplifiers) for each embedded conductor (71, 72, 73, 74, 75, 76, 77, 78) in a corresponding dielectric layer (80, 81, 82, 83, 84, 85, 86, 87) of the laminated wear plate 52. As illustrated in FIG. 3 and FIG. 4, each amplifier (68, 69) comprises an inverting amplifier.

A multiplexer 58 has mux inputs 59 coupled to at least the first output terminal 153 and the second output terminal 253. The multiplexer 58 is selected to provide one mux input 59 for each corresponding output terminal 53 of the embedded conductor (71, 72, 73, 74, 75, 76, 77, 78) for each respective dielectric layer (80, 81, 82, 83, 84, 85, 86, 87) of the laminated wear plate 52.

A controller 66 is adapted or arranged for selecting multiplexer 58 output data from among the mux inputs 59 and for enabling or disabling the primary amplifier 68 or first stage amplifier. As illustrated in FIG. 3 and FIG. 4, controller 66 is connected to multiplexer 58 via selector (line) 50; controller 66 is connected to enable (terminal) 67 of the primary amplifier 68. A controller 66 may comprise a microcontroller, a microprocessor, a logic device, a field programmable gate array, an application specific integrated circuit, a digital signal processor or another electronic data processor.

A shift register 62 or register is configured to store, retrieve, hold, or shift the multiplexer output data outputted by the multiplexer 58 at mux output 61. The multiplexer output data represents a logic level signal, low logic level, or high logic level indicative of whether there is continuity in each respective embedded conductor in its corresponding dielectric layer. For example, if an embedded conductor (71, 72, 73, 74, 75, 76, 77, 78) is broken or severed, then the multiplexer 58 output data represents one logic level, whereas if an embedded conductor is continuous or has integrity the multiplexer 58 output data represents an opposite logic level. The shift register 62 can store a sequence or set of logic levels for the embedded conductors in each successive dielectric layer. Because the embedded conductors (71, 72, 73, 74, 75, 76, 77, 78) in the adjacent dielectric layers (80, 81, 82, 83, 84, 85, 86, 87) must be broken in a predetermined wear sequence of the dielectric layers, the sequence of logic levels in the shift register 62 can indicate anomalies or errors in the estimated wear level. if there are inconsistencies or discontinuities in the predetermined wear sequence of the dielectric layers. For example, if the first conductor 71 is continuous and the second conductor 72 indicates that it is broken, an indication of a second wear level may be erroneous or premature because of the discontinuity in the normal wear sequence.

A data port 63 can communicate the multiplexer 58 output data to user interface 65 to indicate whether the wear plate 52 is at the first threshold wear level or the second threshold wear level, or another wear level.

In one embodiment, the data port 63 is connected to a vehicle data bus 64, such as Control Area Network (CAN) data bus, Ethernet, or another data bus configuration. In turn, the vehicle data bus 64 is coupled to a user interface 65, such as an electronic display. A user interface 65 may comprise an electronic display, a touch screen display, a panel of light emitting diodes, a switch, a keypad, a keyboard, and/or a pointing device (e.g., mouse or trackball or pad).

Additional wear layers or dielectric layers may provide greater information about the wear level of the wear plate 52. For example, additional wear layers may include a third dielectric layer 82, or a fourth dielectric layer 83, or both. A third dielectric layer 82 overlies the second dielectric layer 81 and the third dielectric layer 82 is associated with a third wear depth 93. The third wear depth 93 is associated with a third threshold wear level greater than the second threshold wear level. A third conductor 73 is embedded in the third dielectric 82 layer and separate from the first conductor 71 and the second conductor 72. The third conductor 73 is electrically isolated from the first conductor 71 and the second conductor 72. The third conductor 73 has a third input terminal 351 and a third output terminal 353.

The logic level source 99 is coupled to the first input terminal 14, the second input terminal 114 and the third input terminal. The multiplexer 58 has mux inputs coupled to the first output terminal 16, the second output terminal 116, and the third output terminal. The data port 63 is arranged for communicating the multiplexer 58 output data to user interface 65 to indicate whether the wear plate 10 is at the first threshold wear level, the second threshold wear level, or third threshold wear level.

A fourth dielectric layer 83 overlies the third dielectric layer 82. The fourth dielectric layer 83 is associated with a respective fourth wear depth 94. The fourth wear depth 94 is associated with a fourth threshold wear level greater than the third threshold wear level. A fourth conductor 74 is embedded in the fourth dielectric layer 83 and separate from the first conductor 71 the second conductor 72, and the third conductor 73. The fourth conductor 74 has a fourth input terminal 451 and fourth output terminal 453. The logic level source 99 is coupled to the input terminals 51, such as first input terminal 151, the second input terminal 251, the third input terminal 351, and fourth input terminal 451. The multiplexer 58 having mux inputs coupled to the output terminals 53, such as the first output terminal 153, the second output terminal 253, the third output terminal 353, and the fourth input terminal 453. The data port 63 can communicate with the multiplexer output data to user interface 65 to indicate whether the wear plate 52 is at the first threshold wear level 91, the second threshold wear level 92, third threshold wear level 93, or a fourth wear level 94, or between the following ranges: (1) no wear and the first threshold wear level 91 (e.g., less than the first threshold wear level), (2) the first threshold wear level 91 and the second threshold wear level 92 (e.g., equal to or greater than the first threshold wear level), (3) the second threshold wear level 92 and the third threshold wear level 93 (e.g., equal to or greater than the second threshold wear level), and (4) the third threshold wear level 93 and the fourth threshold wear level 94 (e.g., equal to or greater than the third threshold wear level).

In one example, the first dielectric layer 80, the second dielectric layer 81, the third dielectric layer 82, and fourth dielectric layer 83 collectively comprise a laminated wear plate 52. Further, the first dielectric layer 80, the second dielectric layer 81, third dielectric layer 82 and fourth dielectric layer 83 collectively comprise a wear plate 52 composed of ceramic, a polymer, a plastic, a fiber-filled polymer, a fiber-filled plastic, a plastic composite with ceramic filler particles, or a polymer composite with ceramic filler particles.

FIG. 4 illustrates that as wear occurs, each dielectric layer (80, 81, 82, 83, 84, 85, 86, 87) or part of a dielectric layer is worn away and the conductor embedded (71, 72, 73, 74, 75, 76, 77, 78) in the respective wearing or worn dielectric layer is broken or severed once the wear depth (91, 92, 93, 94) is met or exceeded for a respective wearing or worn dielectric layer. The wear detection device 111, which can include a set of digital continuity circuit detectors, can determine the extent of the wear by the number of dielectric layers affected and the depth of each worn dielectric layer. The wear detection device 111 is not limited to the number of dielectric layers or the complexity of the conductor path or pattern placed in each dielectric layer. The rate at which the embedded conductor (71, 72, 73, 74, 75, 76, 77, 78) is severed or broken can be used for predictive maintenance, to schedule replacement parts, such as wear plates 52 and to estimate when wear plates 52 should be replaced.

While the disclosure has been described in detail in the drawings and foregoing description, the description shall be considered as exemplary and illustrative, rather than restrictive of the scope of protection set forth in the claims. Various illustrative embodiments have been shown and described in this document, such that any changes, variants and modifications that come within the spirit of the disclosure will fall within the scope of the disclosure and its associated claims.

The following is claimed:

1. A device for detecting wear of a wear plate, the device comprising:
   a first dielectric layer;
   a first conductor embedded in the first dielectric layer to a first wear depth, the first wear depth associated with a first threshold wear level;
   a second dielectric layer overlying the first dielectric layer;
   a second conductor embedded in the second dielectric layer to a second wear depth and separate from the first conductor;
   the second wear depth associated with a second threshold wear level greater than the first threshold wear level;
   an indicator for indicating whether the wear plate is worn to the first threshold wear level or to the second threshold wear level, the indicator comprising a first continuity circuit that detects no continuity of the first conductor if the wear plate is worn to the first threshold wear level and a second continuity circuit that detects no continuity of the second conductor if the wear plate is worn to the second threshold wear level; wherein the first continuity circuit comprises a first amplifier that is configured to change a logic level in response to detection of no continuity of the first conductor and wherein the second continuity circuit comprises a second amplifier that is configured to change a logic level in response to detection of no continuity of the second conductor.

2. The device according to claim 1 wherein the indicator comprises:
   a first resistive voltage divider coupled to one end of the first conductor;
   a first light source in series with a resistor connected to a direct current voltage bus;
   the first amplifier having an input coupled to the divided voltage and an output coupled to the first light source, wherein the first amplifier activates the first light source to indicate that the wear plate is worn to the first threshold wear level.

3. The device according to claim 2 wherein an opposite end of the first conductor is grounded and wherein the first amplifier is an inverting amplifier such that if there is continuity in the first conductor the first light source is off because the input to the first amplifier is a low logic level.

4. The device according to claim 2 wherein an opposite end of the first conductor is grounded and wherein the first amplifier is an inverting amplifier such that if there is no continuity in the first conductor the first light source is on because the input to the first amplifier is a high logic level.

5. The device according to claim 2 wherein the first resistive voltage divider provides a low logic level input to the first amplifier if there is continuity in the first conductor and provides a high logic level input to the first amplifier if there is no continuity.

6. The device according to claim 2 wherein the first light source comprises a light emitting diode.

7. The device according to claim 1 wherein the indicator comprises:
   a second resistive voltage divider coupled to one end of the second conductor;
   a second light source in series with a resistor connected to a direct current voltage bus;
   the second amplifier having an input coupled to the divided voltage and an output coupled to the second light source, wherein the second amplifier activates the second light source to indicate that the wear plate is worn to the second threshold wear level.

8. The device according to claim 7 wherein an opposite end of the second conductor is grounded and wherein the second amplifier is an inverting amplifier such that if there is continuity in the second conductor the second light source is off because the input to the second amplifier is a low logic level.

9. The device according to claim 7 wherein an opposite end of the second conductor is grounded and wherein the second amplifier is an inverting amplifier such that if there is no continuity in the second conductor the second light source is on because the input to the second amplifier is a high logic level.

10. The device according to claim 7 wherein the second resistive voltage divider provides a low logic level input to the second amplifier if there is continuity in the second conductor and provides a high logic level input to the second amplifier if there is no continuity.

11. The device according to claim 7 wherein the second light source comprises a light emitting diode.

12. The device according to claim 1 wherein the first wear depth indicates a first wear level of between approximately twenty five percent of a maximum wear level and approximately fifty percent of the maximum wear level.

13. The device according to claim 12 wherein the second wear depth indicates a second wear level of between approximately fifty percent of the maximum wear level and approximately seventy-five percent of the maximum wear level.

14. The device according to claim 1 wherein a first wear level or a second wear level of the wear plate indicates a remaining longevity of the wear plate or when the wear plate is to be scheduled for replacement.

15. The device according to claim 1 wherein the first dielectric layer and the second dielectric layer comprise a wear plate composed of ceramic, a polymer, a plastic, a fiber-filled polymer, a fiber-filled plastic, a plastic composite with ceramic filler particles, or a polymer composite with ceramic filler particles.

16. A device for detecting wear of a wear plate, the device comprising:
   a first dielectric layer;
   a first conductor embedded in the first dielectric layer to a first wear depth, the first wear depth associated with a first threshold wear level, the first conductor having a first input terminal and a first output terminal;
   a second dielectric layer overlying the first dielectric layer
   a second conductor embedded in the second dielectric layer to a second wear depth and separate from the first conductor, the second conductor having a second input terminal and a second output terminal;
   the second wear depth associated with a second threshold wear level greater than the first threshold wear level;
   a logic level source coupled to the first input terminal and the second input terminal;
   a multiplexer having mux inputs coupled to the first output terminal and the second output terminal;

a controller for selecting multiplexer output data from among the mux inputs;

a shift register for storing the multiplexer output data;

a data port for communicating the multiplexer output data to user interface to indicate whether the wear plate is worn to the first threshold wear level or to the second threshold wear level.

17. The device according to claim 16 further comprising:

a third dielectric layer overlying the second dielectric layer to a third wear depth, the third wear depth associated with a third threshold wear level greater than the second threshold wear level;

a third conductor embedded in the third dielectric layer and separate from the first conductor and the second conductor, the third conductor having a third input terminal and third output terminal;

the logic level source coupled to the first input terminal, the second input terminal and the third input terminal;

the multiplexer having mux inputs coupled to the first output terminal, the second output terminal, and the third output terminal;

the data port for communicating the multiplexer output data to user interface to indicate whether the wear plate is at the first threshold wear level, the second threshold wear level, or third threshold wear level.

18. The device according to claim 17 further comprising:

a fourth dielectric layer overlying the third dielectric layer to a fourth wear depth, the fourth wear depth associated with a fourth threshold wear level greater than the third threshold wear level;

a fourth conductor embedded in the fourth dielectric layer and separate from the first conductor the second conductor, and the third conductor, the fourth conductor having a fourth input terminal and fourth output terminal;

the logic level source coupled to the first input terminal, the second input terminal, the third input terminal, and fourth input terminal;

the multiplexer having mux inputs coupled to the first output terminal, the second output terminal, the third output terminal, and the fourth input terminal;

the data port for communicating the multiplexer output data to user interface to indicate whether the wear plate is at the first threshold wear level, the second threshold wear level, third threshold wear level, or a fourth wear level.

19. The device according claim 17 wherein the first dielectric layer, the second dielectric layer, the third dielectric layer, and fourth dielectric layer collectively comprise a wear plate.

20. The device according to claim 17 wherein the first dielectric layer, the second dielectric layer, the third dielectric layer and fourth dielectric layer collectively comprise a wear plate composed of ceramic, a polymer, a plastic, a fiber-filled polymer, a fiber-filled plastic, a plastic composite with ceramic filler particles, or a polymer composite with ceramic filler particles.

\* \* \* \* \*